(12) United States Patent
Weman et al.

(10) Patent No.: US 9,966,257 B2
(45) Date of Patent: May 8, 2018

(54) NANOWIRE EPITAXY ON A GRAPHITIC SUBSTRATE

(75) Inventors: Helge Weman, Ecublens (CH); Bjørn-Ove Fimland, Trondheim (NO); Dong Chul Kim, Trondheim (NO)

(73) Assignee: Norwegian University of Science and Technology, Trondheim (NO)

( * ) Notice: Subject to any disclaimer, the term of this patent is extended or adjusted under 35 U.S.C. 154(b) by 0 days. days.

(21) Appl. No.: 13/993,740

(22) PCT Filed: Dec. 13, 2011

(86) PCT No.: PCT/EP2011/072612
§ 371 (c)(1),
(2), (4) Date: Aug. 27, 2013

(87) PCT Pub. No.: WO2012/080252
PCT Pub. Date: Jun. 21, 2012

(65) Prior Publication Data
US 2013/0334497 A1     Dec. 19, 2013

(30) Foreign Application Priority Data

Dec. 13, 2010 (GB) .................. 1021112.6

(51) Int. Cl.
*H01L 21/02* (2006.01)
*B82Y 40/00* (2011.01)
(Continued)

(52) U.S. Cl.
CPC ........ *H01L 21/02603* (2013.01); *B82Y 10/00* (2013.01); *B82Y 30/00* (2013.01);
(Continued)

(58) Field of Classification Search
CPC ............. H01L 21/0254; H01L 21/0262; H01L 21/02458
(Continued)

(56) References Cited

U.S. PATENT DOCUMENTS 7,442,575 B2 * 10/2008 Coffer ................... B82Y 10/00
                                                            257/14
7,594,982 B1    9/2009 Roscheisen et al.
(Continued)

FOREIGN PATENT DOCUMENTS

| CN | 102376817 | 3/2012 |
| EP | 1829141 | 9/2007 |

(Continued)

OTHER PUBLICATIONS

Chung et al., "Transferrable GaN Layers Grown on ZnO-Coated Graphene layers for Optoelectronic Devices," *Science*, 330:655-657 (2010).
(Continued)

*Primary Examiner* — Quoc Hoang
(74) *Attorney, Agent, or Firm* — Meunier Carlin & Curfman LLC

(57) ABSTRACT

A composition of matter comprising at least one nanowire on a graphitic substrate, said at least one nanowire having been grown epitaxially on said substrate, wherein said nanowire comprises at least one group III-V compound or at least one group II-VI compound or comprises at least one non carbon group (IV) element.

10 Claims, 7 Drawing Sheets

(51) Int. Cl.
*H01L 29/06* (2006.01)
*B82Y 30/00* (2011.01)
*B82Y 10/00* (2011.01)
*H01L 29/16* (2006.01)

(52) U.S. Cl.
CPC ........ *B82Y 40/00* (2013.01); *H01L 21/02376* (2013.01); *H01L 21/02538* (2013.01); *H01L 21/02551* (2013.01); *H01L 21/02631* (2013.01); *H01L 21/02645* (2013.01); *H01L 21/02653* (2013.01); *H01L 29/0676* (2013.01); *H01L 29/1606* (2013.01)

(58) Field of Classification Search
USPC .................................. 257/615, 616, E51.038
See application file for complete search history.

(56) References Cited

U.S. PATENT DOCUMENTS

| | | | |
|---|---|---|---|
| 7,608,147 B2* | 10/2009 | Samuelson et al. | 117/89 |
| 7,911,035 B2* | 3/2011 | Seifert et al. | 257/615 |
| 7,965,960 B2 | 6/2011 | Kim et al. | |
| 8,440,350 B1 | 5/2013 | Verbrugge et al. | |
| 8,417,153 B2 | 8/2013 | Kim et al. | |
| 2002/0175408 A1 | 11/2002 | Manjumdar | |
| 2003/0044608 A1 | 3/2003 | Yoshizawa et al. | |
| 2006/0125056 A1 | 6/2006 | Samuelson et al. | |
| 2006/0188774 A1 | 8/2006 | Niu et al. | |
| 2007/0177139 A1 | 8/2007 | Kamins et al. | |
| 2007/0212538 A1 | 9/2007 | Niu | |
| 2008/0081439 A1 | 4/2008 | Coffer et al. | |
| 2008/0142066 A1 | 6/2008 | Plissonnier et al. | |
| 2008/0142926 A1 | 6/2008 | Seifert et al. | |
| 2008/0191317 A1 | 8/2008 | Cohen et al. | |
| 2009/0057649 A1 | 3/2009 | Sutter et al. | |
| 2009/0176159 A1 | 7/2009 | Zhamu et al. | |
| 2009/0235862 A1 | 9/2009 | Cha et al. | |
| 2009/0293946 A1 | 12/2009 | Lin | |
| 2010/0035412 A1 | 2/2010 | Samuelson et al. | |
| 2010/0155702 A1 | 6/2010 | Wernersson et al. | |
| 2010/0171096 A1 | 7/2010 | Sutter | |
| 2010/0252808 A1 | 10/2010 | Samuelson et al. | |
| 2010/0314617 A1 | 12/2010 | Ito | |
| 2010/0327258 A1 | 12/2010 | Lee et al. | |
| 2011/0030991 A1 | 2/2011 | Veerasamy et al. | |
| 2011/0121264 A1* | 5/2011 | Choi | B82Y 10/00 257/14 |
| 2011/0129675 A1 | 6/2011 | Choi et al. | |
| 2011/0133061 A1 | 6/2011 | Yu | |
| 2011/0163292 A1 | 7/2011 | Wang et al. | |
| 2011/0168256 A1 | 7/2011 | Wang et al. | |
| 2011/0175059 A1 | 7/2011 | Kahen et al. | |
| 2011/0177683 A1 | 7/2011 | Kahen et al. | |
| 2011/0220171 A1 | 9/2011 | Mathai et al. | |
| 2011/0220864 A1 | 9/2011 | Kim et al. | |
| 2011/0240099 A1 | 10/2011 | Ellinger et al. | |
| 2011/0313194 A1 | 12/2011 | Lee et al. | |
| 2012/0021554 A1 | 1/2012 | Neel et al. | |
| 2012/0041246 A1 | 2/2012 | Scher et al. | |
| 2012/0068122 A1 | 3/2012 | Kranbuehl et al. | |
| 2012/0068157 A1 | 3/2012 | Kub et al. | |
| 2012/0090057 A1 | 4/2012 | Cohen et al. | |
| 2012/0132930 A1 | 5/2012 | Young et al. | |
| 2012/0135158 A1 | 5/2012 | Freer et al. | |
| 2012/0141799 A1 | 6/2012 | Kub et al. | |
| 2012/0145549 A1 | 6/2012 | Cho et al. | |
| 2012/0192931 A1* | 8/2012 | Jeon | B82Y 30/00 136/252 |
| 2012/0241192 A1 | 9/2012 | Cai et al. | |
| 2012/0270054 A1 | 10/2012 | Hong et al. | |
| 2013/0158322 A1 | 6/2013 | Nyce et al. | |
| 2013/0213470 A1 | 8/2013 | Yi | |
| 2013/0221322 A1 | 8/2013 | Ohlsson et al. | |
| 2013/0280894 A1 | 10/2013 | Lee et al. | |
| 2014/0151826 A1 | 6/2014 | Kelber et al. | |
| 2014/0161730 A1 | 6/2014 | Sitharaman et al. | |
| 2014/0182668 A1 | 7/2014 | Pacifici | |
| 2014/0252316 A1 | 9/2014 | Yan et al. | |
| 2014/0293164 A1 | 10/2014 | Kim et al. | |
| 2015/0194549 A1 | 7/2015 | Helge et al. | |
| 2015/0311363 A1 | 10/2015 | Park et al. | |
| 2016/0005751 A1 | 1/2016 | Tsui et al. | |

FOREIGN PATENT DOCUMENTS

| | | |
|---|---|---|
| EP | 1952467 | 8/2008 |
| KR | 2009/0003840 | 4/2009 |
| KR | 20120092431 | 8/2012 |
| WO | 2006/062947 | 6/2006 |
| WO | 2007/061945 | 5/2007 |
| WO | 2010/056061 | 5/2010 |
| WO | 2010/096035 | 8/2010 |
| WO | 2011/016837 | 2/2011 |
| WO | 2011/081440 | 7/2011 |
| WO | 2011090863 | 7/2011 |
| WO | 2011016837 | 2/2012 |
| WO | 2012/080252 | 6/2012 |
| WO | 2013/104723 | 7/2013 |

OTHER PUBLICATIONS

Dheeraj et al., "Controlling crystal phases in GaAs nanowires grown by Au-assisted molecular beam epitaxy," Norwegian University of Science and Technology, NO-7491, Trondheim, Norway, Fifth "Nanowire Growth Workshop" Nov. 4-5, 2010, Rome, Italy, 2 pages.

International Preliminary Report on Patentability and Written Opinion, dated Jun. 18, 2013, in connection with corresponding International Application No. PCT/EP2011/072612.

International Search Report, dated May 2, 2012, in connection with corresponding International Application No. PCT/EP2011/072612.

Kim et al., "Vertically aligned ZnO nanostructures grown on grapheme layers," *Applied Physics Letters*, 95:213101-1 through 213101-3 (2009).

Paek et al., "MBE-VLS growth of GaAs nanowires on (111)Si substrate," *Physica Status Solidi* (C), 5(9):2740-2742 (2008).

Patsha et al., "Growth of GaN nanostructures on graphene," *Nanoscience*, 2011 International Conference on Engineering and Technology, pp. 553-55, Nov. 28, 2011.

Peng et al., "Control of growth orientation of GaN nanowires," *Chemical Physics Letters*, 359:241-245 (2002).

Plissard et al., Gold-free growth of GaAs nanowires on silicon: arrays and polytypism, *Nanotechnology*, 21:1-8 (2010).

Wang et al., "Nanocrystal Growth on Graphene with Various Degrees of Oxidation," *J. Am. Chem. Soc.* ,132:3270-3271 (2010).

Yoon et al., "Vertical Epitaxial $Co_5Ge_7$ Nanowire and Nanobelt Arrays on a Thin Graphic Layer for Flexible Field Emission Displays," *Advanced Materials*, 21:4979-4982 (2009).

Mariani et al., Patterned Radial GaAs Nanopillar Solar Cells. Nano Letters 2011, 11, 2490-2494.

Mohseni et al., Hybrid GaAs-Nanowire-Carbon-Nanotube Flexible Photovoltaics. IEEE Journal of Selected Topics in Quantum Electronics 2011, 17(4), 1070-1077.

Nistor et al., The Role of Chemistry in Graphene Doping for Carbon-Based Electronics. ACS Nano 2011, 5(4), 3096-3103.

Park et al., Inorganic Nanostructures Grown on Graphene Layers. Nanoscale 2011, 3(9), 3522-3533.

Sun et al., Compound Semiconductor Nanowire Solar Cells. IEEE Journal of Selected Topics in Quantum Electronics 2011, 17(4), 1033-1049.

Wang, et al., "Growth of nanowires," Materials Science and Engineering, vol. 60, Issues 1-6, 2008, pp. 1-51.

International Preliminary Report on Patentability and Written Opinion, dated Jul. 15, 2014, in connection with corresponding International Application No. PCT/EP2013/050419.

International Search Report, dated Apr. 8, 2013, in connection with corresponding International Application No. PCT/EP2013/050419.

(56) References Cited

OTHER PUBLICATIONS

Non-final Office Action, dated Dec. 3, 2015, received in connection with U.S. Appl. No. 14/409,837.
Final Office Action issued in related U.S. Appl. No. 14/409,837, dated Jul. 14, 2016.
Non-Final Office Action issued in related U.S. Appl. No. 14/409,837, dated Feb. 2, 2017.
Final Office Action issued in related U.S. Appl. No. 14/371,621, dated Oct. 17, 2016.
Marzouki, et al., "Structural and optical characterizations of nitrogen-doped ZnO nanoriwres grown by MOCV", Materials Letters 64, 2010, 2112-2114.
Yu et al. "Electronic properties of nitrogen-atom-adsorbed graphene nanoribbons with armchair edges", IEEE Transactions on Nanotechnology, vol. 9, No. 2, Mar. 2010.
Office Action issued in co-pending U.S. Appl. No. 14/371,621, dated May 3, 2017.
Office Action issued in co-pending U.S. Appl. No. 14/409,837, dated Aug. 28, 2017.

\* cited by examiner

NANOWIRE EPITAXY ON A GRAPHITIC SUBSTRATE

This invention concerns a process for growing nanowires epitaxially on graphitic substrates. In particular, the invention employs molecular beam epitaxy techniques to grow nanowires epitaxially and ideally vertically on graphitic substrates. The resulting supported nanowires form a further aspect of the invention. The nanowires are preferably semiconductor materials and have wide ranging applications in, for example, the electronics industry or in solar cell applications.

Over recent years, the interest in semiconductor nanowires has intensified as nanotechnology becomes an important engineering discipline. Nanowires, which are also referred to as nanowhiskers, nanorods, nanopillars or nanocolumns etc by some authors, have found important applications in a variety of electrical devices such as sensors, solar cells to LED's.

For the purpose of this application, the term nanowire is to be interpreted as a structure being essentially in one-dimensional form, i.e. is of nanometer dimensions in its width or diameter and its length typically in the range of a few 100 nm to a few µm. Usually, nanowires are considered to have at least two dimensions not greater than 200 nm.

Controlling the one-dimensional growth on the nanometer scale offers unique opportunities for combining materials, and manipulating properties, including mechanical, electrical, optical, thermoelectrical, piezoelectrical and electromagnetical properties, and to design novel devices.

Many different types of nanowires exist, including metallic (e.g., Ni, Pt, Au), semiconducting (e.g., Si, InP, GaN, GaAs, ZnO etc.), and insulating (e.g., $SiO_2$, $TiO_2$) nanowires. The present inventors are primarily concerned with semi-conductor nanowires although it is envisaged that the principles outlined in detail below are applicable to all manner of nanowire technology.

Conventionally, semi-conductor nanowires have been grown on a substrate identical to the nanowire itself (homoepitaxial growth). Thus GaAs nanowires are grown on GaAs substrates and so on. This, of course, ensures that there is a lattice match between the crystal structure of the substrate and the crystal structure of the growing nanowire. Both substrate and nanowire can have identical crystal structures.

Growing a nanowire on a matching substrate is, however, very expensive and limiting. For example, GaAs substrates need to be specifically manufactured and that is expensive. In order to ensure nanowire growth in the normally favoured [111]B direction, the substrate needs to be specially sliced to have (111)B oriented surface, as compared to the more normal substrate with (001) oriented surface. (111)B oriented GaAs substrates are more expensive than (001) oriented GaAs substrates. Also, GaAs is not the ideal material to carry a nanowire anyway. It is not mechanically strong or inert for example. It is not flexible or transparent. It would be better if other more attractive substrates could be employed.

The present inventors sought ways of moving away from these limiting substrates. Of course, doing so is not just a matter of using a different substrate. As soon as the substrate is different from the nanowire being grown then there is, by definition, a potential lattice mismatch between substrate and nanowire as well as numerous other possible problems to consider. Nevertheless, the literature contains attempts by other workers to grow semiconductor nanowires on alternative substrates.

In Plissard et al., Nanotechnology 21 (2010), 385602-10, attempts have been made to grow vertical GaAs nanowires on silicon (111) oriented substrates using Ga as a catalyst. Silicon is obviously, a preferred electronics substrate but it too is expensive in pure form. Moreover, it is not transparent and is not flexible. It also suffers from a negative interaction with gold, a catalyst often used in nanowire growth. Gold can diffuse into silicon and create mid-gap defect states in the nanowire and substrate. Plissard et al. concludes, in fact, that the use of gold with a Si substrate is not possible and develops a gold free nanowire growth technique.

The present inventors sought to grow nanowires epitaxially on graphitic substrates. Graphitic substrates are substrates composed of single or multiple layers of graphene or its derivatives. In its finest form, graphene is a one atomic layer thick sheet of carbon atoms bound together with double electron bonds (called a $sp^2$ bond) arranged in a honeycomb lattice pattern. Unlike other semiconductor substrates such as GaAs substrates, graphitic substrates are very cheap, readily available materials which offer an ideal substrate for growth of nanowires. The use of few layered graphene substrates is ideal as these are thin, light, and flexible, yet very strong. Their electrical properties can be modified from highly electrically conducting to insulating. It is also impervious to anything, very inert and hence compatible with gold and other catalysts.

However, defect free epitaxial growth of nanowires between such different material classes is not obvious, since (most) semiconductors are three dimensional like with reactive dangling bonds at the surface, whereas graphite has a two dimensional honeycomb structure with no dangling bonds at the surface and thus forms a very inert and hydrophobic surface.

Growing nanowires on substrates such as graphite can also be challenging as large lattice mismatches between the substrate and the growing nanowire were perceived to exist. Large lattice mismatches can lead to defective nanowires with dislocations or in fact to no nanowire growth at all. It is important to grow the nanowire epitaxially so that the nanowire will be ordered and adopts a compatible crystal structure that matches the substrate.

For many applications it will be important that the nanowires can be grown vertically, perpendicular to the substrate surface. Semiconductor nanowires normally grow in the [111] direction (if cubic crystal structure) or the [0001] direction (if hexagonal crystal structure). This means that the substrate surface needs to be (111) or (0001) oriented where the surface atoms of the substrate is arranged in a hexagonal symmetry.

There remain many hurdles to overcome before a semiconductor nanowire can be grown on a graphitic surface.

As noted above, attempts have been made to grow vertical GaAs nanowires on Si(111) substrates. The present invention concerns only graphitic substrates. Some attempts have been made to grow crystalline nanomaterials on graphitic substrates too.

In JACS, 2010, 132, 3270-3271 nanocrystals of oxides and hydroxides of Ni, Co and Fe are synthesised on a graphene support.

In Appl. Phys Lett. 95, 213101 (2009), Kim et al. report vertically aligned ZnO nanostructures grown on graphene layers. These were grown using catalyst free metal-organic vapour phase epitaxy (MOVPE) and the surface morphology of the ZnO nanostructures was dependent on the growth temperature.

The present inventors have found that epitaxial nanowires of certain compounds/elements can be grown on graphitic substrates. Since graphitic substrates have no dangling bonds at the surface and very short atomic bond length compared with typical semiconductors like silicon and GaAs there is no reason to anticipate nucleation and epitaxial growth of nanowires thereon. As surprisingly noted below, there is a good lattice match with many semiconductors when using graphene depending on how the semiconductor atoms are placed on the surface of graphene.

In particular, the use of molecular beam epitaxy offers excellent results in terms of nanowire growth. In particular the invention enables the growth of group IV, II-VI or in particular group III-V semiconductor nanowires on graphitic substrates. Moreover, this is believed to be the first disclosure of any group III-V epitaxial nanowire grown on a graphitic substrate, and the first disclosure of any catalyst assisted epitaxial nanowire grown on a graphitic substrate.

SUMMARY OF INVENTION

Thus, viewed from one aspect the invention provides a composition of matter comprising at least one nanowire on a graphitic substrate, said at least one nanowire having been grown epitaxially on said substrate, wherein said nanowire comprises at least one group III-V compound or at least one group II-VI compound or comprises at least one non carbon group IV element.

Viewed from another aspect the invention provides a process for preparing at least one nanowire grown epitaxially on a graphitic substrate comprising the steps of:

(I) providing group II-VI elements or group III-V elements or at least one non carbon group IV element to the surface of said graphitic substrate, preferably via a molecular beam; and (II) epitaxially growing at least one nanowire from the surface of the graphitic substrate.

Viewed from another aspect the invention provides a process for preparing at least one nanowire grown epitaxially on a graphitic substrate in the presence of a catalyst comprising the steps of:

(I) providing group II-VI elements or group III-V elements or at least one non carbon group IV element to the surface of said graphitic substrate, preferably via a molecular beam; and (II) epitaxially growing at least one nanowire from the surface of the graphitic substrate.

Optionally, the surface of the graphitic substrate can be chemically/physically modified to enhance the epitaxial growth of nanowires.

Viewed from another aspect the invention provides a nanowire made by a process as hereinbefore defined.

Viewed from another aspect the invention provides a device, such as an electronic device, comprising a composition as hereinbefore defined, e.g. a solar cell.

Viewed from another aspect the invention provides the use of molecular beam epitaxy to grow at least one nanowire as hereinbefore defined on a graphitic substrate.

Definitions

By a group III-V compound is meant one comprising at least one ion from group III and at least one ion from group V. Similarly, a group II-VI compound is one comprising at least one group II ion and at least one group VI ion. There may be more than one ion present from each group, e.g. InGaAs and so on. Non carbon group IV nanowires are those that contain at least one non carbon group IV element only, for example a Si nanowire.

The term nanowire is used herein to describe a solid, wire like structure of nano dimensions. Nanowires preferably have an even diameter throughout the majority of the nanowire, e.g. at least 75% of its length. The term nanowire is intended to cover the use of nanorods, nanopillars, nanocolumns or nanowhiskers some of which may have tapered end structures. The nanowires can be said to be in essentially in one-dimensional form with nanometer dimensions in their width or diameter and their length typically in the range of a few 100 nm to a few µm. Typically, the nanowire will have two dimensions not greater than 200 nm.

Ideally, the diameter at the base of the nanowire and at the top of the nanowire should remain about the same (e.g. within 20% of each other). It will be appreciated that the wire has to narrow at the very top, typically forming a hemisphere.

It will be appreciated that the substrate preferably comprises a plurality of nanowires. This may be called an array of nanowires.

Graphitic substrates are substrates composed of single or multiple layers of graphene or its derivatives. The term graphene refers to a planar sheet of $sp^2$-bonded carbon atoms in a honeycomb crystal structure. Derivatives of graphene are those with surface modification. For example, the hydrogen atoms can be attached to the graphene surface to form graphane. Graphene with oxygen atoms attached to the surface along with carbon and hydrogen atoms is called as graphene oxide. The surface modification can be also possible by chemical doping or oxygen/hydrogen plasma treatment.

The term epitaxy comes from the Greek roots epi, meaning "above", and taxis, meaning "in ordered manner". The atomic arrangement of the nanowire is based on the crystallographic structure of the substrate. It is a term well used in this art. Epitaxially growth means herein the growth on the substrate of a nanowire that mimics the orientation of the substrate.

Molecular beam epitaxy (MBE) is a method of forming depositions on crystalline substrates. The MBE process is performed by heating a crystalline substrate in a vacuum so as to energize the substrate's lattice structure. Then, an atomic or molecular mass beam(s) is directed onto the substrate's surface. The term element used above is intended to cover application of atoms, molecules or ions of that element. When the directed atoms or molecules arrive at the substrate's surface, the directed atoms or molecules encounter the substrate's energized lattice structure or a catalyst droplet as described in detail below. Over time, the oncoming atoms form a nanowire.

DETAILED DESCRIPTION OF INVENTION

This invention concerns the epitaxial growth of nanowires on a graphitic substrate. The composition of the invention comprises both the substrate and the nanowires grown thereon.

Having a nanowire grown epitaxially provides homogeneity to the formed material which may enhance various end properties, e.g. mechanical, optical or electrical properties.

Epitaxial nanowires may be grown from gaseous or liquid precursors. Because the substrate acts as a seed crystal, the deposited nanowire can take on a lattice structure and orientation identical to those of the substrate. This is different from other thin-film deposition methods which deposit polycrystalline or amorphous films, even on single-crystal substrates.

In the present invention, the substrate is a graphitic substrate, more especially it is graphene. As used herein, the term graphene refers to a planar sheet of $sp^2$-bonded carbon atoms that are densely packed in a honeycomb (hexagonal) crystal lattice. This graphene substrate should contain no more than 10 layers of graphene or its derivatives, preferably no more than 5 layers (which is called as a few-layered graphene). Especially preferably, it is a one-atom-thick planar sheet of graphene.

The crystalline or "flake" form of graphite consists of many graphene sheets stacked together (i.e. more than 10 sheets). By graphitic substrate therefore, is meant one formed from one or a plurality of graphene sheets.

It is preferred if the substrate is 20 nm in thickness or less. Graphene sheets stack to form graphite with an interplanar spacing of 0.335 nm. The substrate preferred comprises only a few such layers and may ideally be less than 10 nm in thickness. Even more preferably, it may be 5 nm or less in thickness. The area of the substrate is not limited. This might be as much as 0.5 $mm^2$ or more, e.g. up to 5 $mm^2$ or more such as up to 10 $cm^2$. The area of the substrate is thus only limited by practicalities.

It will be clear that the graphitic substrate may need to be supported in order to allow growth of the nanowires thereon. The graphene sheet can be supported on any kind of materials including conventional semiconductor substrates and transparent glasses. The use of silica is preferred. The support must be inert. It is also possible to grow the graphitic substrate directly on a Ni film deposited on an oxidized silicon wafer or directly on Cu foils. Then the graphitic substrates can be detached from the metal by etching and easily transferred on to any materials. In a highly preferred embodiment, the graphitic substrate is a laminated substrate exfoliated from a Kish graphite, or is a highly ordered pyrolytic graphite (HOPG). Alternatively, it could be a chemical vapour deposition (CVD)-grown graphene substrate on a Ni film or Cu foil.

Whilst it is preferred if the graphitic substrate is used without modification, the surface of the graphitic substrate can be modified. For example, it can be treated with plasma of hydrogen, oxygen, $NO_2$ or their combinations. Oxidation of the substrate might enhance nanowire nucleation. It may also be preferable to pretreat the substrate, for example, to ensure purity before nanowire growth. Treatment with a strong acid such as HF or BOE is an option. Substrates might be washed with iso-propanol, acetone, or n-methyl-2-pyrrolidone to eliminate surface impurities.

The cleaned graphitic surface can be further modified by doping. Dopant atoms or molecules may act as a seed for growing nanowires. A solution of $FeCl_3$, $AuCl_3$ or $GaCl_3$ could be used in a doping step.

The use of graphitic substrates, ideally thin graphitic substrates, is highly advantageous in the present invention as these are thin but very strong, light and flexible, highly electrically conducting and thermally conducting. They are transparent at the low thicknesses preferably employed herein, they are impermeable and inert.

In order to prepare nanowires of commercial importance, it is essential that these grow epitaxially on the substrate. It is also ideal if growth occurs perpendicular to the substrate and ideally therefore in the [111] (for cubic crystal structure) or [0001] (for hexagonal crystal structure) direction. As noted above, there is no guarantee that this is possible with a particular substrate where that substrate material is different from the nanowire being grown. The present inventors have determined, however, that epitaxial growth on graphitic substrates is possible by determining a possible lattice match between the atoms in the semiconductor nanowire and the carbon atoms in the graphene sheet.

The carbon-carbon bond length in graphene layers is about 0.142 nm. Graphite has hexagonal crystal geometry. This is shown in FIG. 1a. The present inventors have surprisingly realised that graphite can provide a substrate on which semiconductor nanowires can be grown as the lattice mismatch between the growing nanowire material and the graphitic substrate can be very low.

The inventors have realised that due to the hexagonal symmetry of the graphitic substrate and the hexagonal symmetry of the semiconductor atoms in the (111) planes of a nanowire growing in the [111] direction with a cubic crystal structure (or in the (0001) planes of a nanowire growing in the [0001] direction with a hexagonal crystal structure), a lattice match can be achieved between the growing nanowires and the substrate. FIG. 1a shows the hexagonal positions of the semiconductor atoms in the (111) (or (0001)) planes of a nanowire on top of the hexagonal carbon atoms of the graphene layer, placed in such a way that no lattice mismatch will occur.

An exact lattice match can be achieved if the lattice constant, a, of a cubic semiconductor crystal (the lattice constant, a, is defined as the side length of the cubic unit cell) is equal to: 1.422 Å (carbon atom distance)×3×sqr(2)=6.033 Å.

This is close to the lattice constant of most group III-V compounds such as InAs, GaAs, InP, GaSb, InSb, GaP and AlAs, and II-VI compounds such as MgSe, ZnTe, CdSe, and ZnSe semiconductor crystals.

In particular, this is close to the lattice constant of group III-V compounds such as InAs (a=6.058 Å), GaSb (a=6.096 Å) and AlSb (a=6.136 Å), and II-VI compounds such as ZnTe (a=6.103 Å) and CdSe (a=6.052 Å) semiconductor crystals.

Exact lattice matches can also be achieved if the lattice constant, $a_1$, of a hexagonal semiconductor crystal (the lattice constant, $a_1$, is defined as the side length of the hexagonal base of the hexagonal unit cell) is equal to: 1.422 Å (carbon atom distance)×3=4.266 Å. We show this in FIG. 1a. This is close to the $a_1$ lattice constants (same as the distance between the semiconductor atoms) of the hexagonal forms of the II-VI materials CdS ($a_1$=4.160 Å) and CdSe ($a_1$=4.30 Å) crystals.

It should also be noted that many of these semiconductors crystals can be formed in both cubic and hexagonal crystal structure during nanowire growth, in contrast to bulk or thin film growth where normally only one of these crystal forms are stable. The atomic distance in the cubic lattice and the hexagonal lattice of the same semiconductor are typically almost the same so that $a=a_1 \times sqr(2)$, and therefore the lattice mismatch to the graphitic layer will also be almost the same for both crystal structures.

Without wishing to be limited by theory, due to the hexagonal symmetry of the carbon atoms in graphitic layers, and the hexagonal symmetry of the atoms of cubic or hexagonal semiconductors in the [111] and [0001] crystal direction, respectively, (a preferred direction for most nanowire growth), a close lattice match between the graphitic substrate and semiconductor can be achieved when the semiconductor atoms are placed above the carbon atoms of the graphitic substrate, ideally in a hexagonal pattern. This is a new and surprising finding and can enable the epitaxial growth of nanowires on graphitic substrates.

In FIG. 1a the semiconductor atoms are placed above some particular centres of the hexagonal carbon rings, such as hollow (H-site). Instead of being placed on top of H-sites, all the semiconductor atoms may also be rigidly shifted so that they are above a bridge (B-site) between carbon atoms or all centred on top (T-site) of carbon atoms in a way that a hexagonal symmetric pattern is still maintained. These three different hexagonal arrangements of the semiconductor atoms then give the same requirement on the semiconductor lattice constants. Which placement (above H—, B- or T-site position) the semiconductor atoms take relative to the carbon atoms of the graphitic substrate might depend on the semiconductor (whether it is an element from group II, III, IV, V or VI etc.) and how the chemical bonds form.

In the descriptions above, all semiconductor atoms would have the same local position (above H-, B- or T-site position) on top of the graphitic surface. It is also possible to maintain a hexagonal symmetry of the semiconductor atoms if the atoms are placed above both H- and B-sites (FIG. 1b) or above both H- and T-sites (FIG. 1c). With the atomic positions as shown in FIGS. 1b and 1c, this gives two additional values for lattice matching of semiconductor atoms with the graphitic surface. If the semiconductor atoms are placed above alternating H- and B-sites as in FIG. 1b, an exact lattice match can be achieved if the lattice constant, a, of a cubic semiconductor crystal is equal to: 1.422 Å×3/2×sqr(6)=5.225 Å. This is close to the lattice constant of Si (a=5.43 Å), GaP (a=5.45 Å), AlP (a=5.45 Å), InN (a=4.98 Å) and ZnS (a=5.42 Å). For hexagonal semiconductor crystals exact lattice matches will be achieved if the lattice constant, $a_1$, of a is equal to: 1.422 Å×3/2×sqr(3)=3.694 Å. This is close to the $a_1$ lattice constants of the hexagonal forms of InN ($a_1$=3.54 Å) and ZnS ($a_1$=3.82 Å) crystals.

If the semiconductor atoms are placed above alternating H- and T-sites as in FIG. 1c, an exact lattice match can be achieved if the lattice constant, a, of a cubic semiconductor crystal is equal to: 1.422 Å×2×sqr(2)=4.022 Å. Few cubic semiconductors exist with lattice constants close to this value, with the closest being 3C SiC (a=4.36 Å). For hexagonal semiconductor crystals, exact lattice matches will be achieved if the lattice constant, $a_1$, of a is equal to: 1.422 Å×2=2.844 Å. Few hexagonal semiconductors exist with lattice constants close to this value, with the closest being SiC ($a_1$=3.07 Å), AlN ($a_1$=3.11 Å), GaN ($a_1$=3.19 Å) and ZnO ($a_1$=3.25 Å) crystals.

The five different hexagonal arrangements of the semiconductor atoms as described above, can enable semiconductor nanowires of such materials to be vertically grown to form free standing nanowires on top of a thin carbon-based graphitic material.

Whilst it is ideal that there is no lattice mismatch between a growing nanowire and the substrate, nanowires can accommodate much more lattice mismatch than thin films for example. The nanowires of the invention may have a lattice mismatch of up to about 10% with the substrate and epitaxial growth is still possible. Ideally, lattice mismatches should be 7.5% or less, e.g. 5% or less.

For some semiconductors like cubic InAs (a=6.058 Å), cubic GaSb (a=6.093 Å), cubic CdSe (a=6.052 Å), and hexagonal CdSe ($a_1$=4.30 Å) the lattice mismatch is so small (<~1%) that excellent growth of these semiconductors can be expected.

For some semiconductors like GaAs (a=5.653 Å) the lattice mismatch is quite similar when the semiconductor atoms are placed on the same sites as in FIG. 1a (a=6.033 Å and thus the lattice constant for GaAs is 6.3% smaller), or alternating H- and B-sites as in FIG. 1b (a=5.255 Å and thus the lattice constant for GaAs is 8.2% larger), that both arrangements are possible.

The process of the invention can enable semiconductor nanowires of the above mentioned materials to be vertically grown to form free standing nanowires on top of a thin carbon-based graphitic material.

The nanowire grown in the present invention may be from 250 nm to several microns in length, e.g. up to 5 microns. Preferably the nanowires are at least 1 micron in length. Where a plurality of nanowires are grown, it is preferred if they all meet these dimension requirements. Ideally, at least 90% of the nanowires grown on a substrate will be at least 1 micron in length. Preferably substantially all the nanowires will be at least 1 micron in length.

Moreover, it will be preferred if the nanowires grown have the same dimensions, e.g. to within 10% of each other. Thus, at least 90% (preferably substantially all) of the nanowires on a substrate will preferably be of the same diameter and/or the same length (i.e. to within 10% of the diameter/length of each other). Essentially, therefore the skilled man is looking for homogeneity and nanowires than are substantially the same in terms of dimensions.

The length of the nanowires is often controlled by the length of time for which the growing process runs. A longer process typically leads to a (much) longer nanowire.

The nanowires have typically a hexagonal cross sectional shape. The nanowire may have a cross sectional diameter of 25 to 200 nm (i.e. its thickness). As noted above, the diameter is ideally constant throughout the majority of the nanowire. Nanowire diameter can be controlled by the manipulation of the ratio of the atoms used to make the nanowire as described further below.

Moreover, the length and diameter of the nanowires can be affected by the temperature at which they are formed. Higher temperatures encourage high aspect ratios (i.e. longer and/or thinner nanowires). The skilled man is able to manipulate the growing process to design nanowires of desired dimensions.

The nanowires of the invention are formed from at least one III-V compound, at least one II-VI compound or they can be nanowires grown from at least one group IV element selected from Si, Ge, Sn or Pb, especially Si and Ge. The formation therefore of pure group IV nanowires or nanowires such as SiC and SiGe is envisaged.

Group II elements are Be, Mg, Ca, Zn, Cd, and Hg. Preferred options here are Zn and Cd.

Group III options are B, Al, Ga, In, and Tl. Preferred options here are Ga, Al and In.

Group V options are N, P, As, Sb. All are preferred.

Group VI options include O, S, Se and Te. The use of Se and Te is preferred.

The manufacture of a group III-V compound is preferred. It will be appreciated that any compound which forms during nanowire growth need not be completely stoichiometric as the possibility of doping exists, as discussed below.

Preferred compounds for nanowire manufacture include InAs, GaAs, InP, GaSb, InSb, GaP, ZnTe, CdSe and ZnSe. The use of GaAs or InAs is highly preferred. Other options include Si, ZnO, GaN, AlN and InN.

Whilst the use of binary materials is preferred, there is no reason why ternary or quaternary nanowires etc. cannot be grown by the method of the invention. As long as the lattice of the compound in question matches that of the substrate, especially graphene, then epitaxial growth can be expected. Thus, ternary systems in which there are two group (III) cations with a group (V) anion are an option here, such as InGaAs. Other options will be clear to the skilled man.

It is within the scope of the invention for the nanowires to be doped. Doping typically involves the introduction of impurity ions into the nanowire. These can be introduced at a level of up to $10^{19}/cm^3$, preferably up to $10^{18}/cm^3$. The nanowires can be undoped, p-doped or n-doped as desired. Doped semiconductors are extrinsic conductors whereas non doped ones are intrinsic.

Extrinsic semiconductors with a larger electron concentration than hole concentration are known as n-type semiconductors. In n-type semiconductors, electrons are the majority carriers and holes are the minority carriers. N-type semiconductors are created by doping an intrinsic semiconductor with donor impurities. Suitable donors for III-V compounds can be e.g. Si and Te. Suitable donors for group IV semiconductors can be e.g. P and As.

The p-type semiconductors have a larger hole concentration than electron concentration. The phrase 'p-type' refers to the positive charge of the hole. In p-type semiconductors, holes are the majority carriers and electrons are the minority carriers. P-type semiconductors are created by doping an intrinsic semiconductor with acceptor impurities. Suitable acceptors for III-V compounds can be e.g. Be and Zn. Suitable acceptors for group IV semiconductors can be e.g. B. It will be appreciated that whether an impurity will act as a donor or acceptor in a III-V compound will in some cases depend on the orientation of the growing surface and the growth conditions. Dopants can be introduced during the growth process or by ion implantation of the nanowires after their formation.

The nanowires of the invention grow epitaxially. They attach to the underlying graphitic substrate through covalent or quasi van der Waals binding. Accordingly, at the junction of the substrate and the base of the nanowire, crystal planes are formed epitaxially within the nanowire. These build up, one upon another, in the same crystallographic direction thus allowing the epitaxial growth of the nanowire. Preferably the nanowires grow vertically. The term vertically here is used to imply that the nanowires grow perpendicular to the graphitic support. It will be appreciated that in experimental science the growth angle may not be exactly 90° but the term vertically implies that the nanowires are within about 10° of vertical/perpendicular, e.g. within 5°.

It will be appreciated that the substrate preferably comprises a plurality of nanowires. Preferably the nanowires grow about parallel to each other. It is preferred therefore if at least 90%, e.g. at least 95%, preferably substantially all nanowires grow in the same direction from the same plane of the substrate.

It will be appreciated that there are many planes within a substrate where epitaxial growth could occur. It is preferred if substantially all nanowires grow in the same plane so that they are parallel. Most preferably that plane is perpendicular to the substrate.

The nanowires of the invention should preferably grow in the [111] direction for nanowires with cubic crystal structure and [0001] direction for nanowires with hexagonal crystal structure. If the crystal structure of the growing nanowire is cubic, this also represents the (111) interface between the cubic nanowire and the catalyst droplet where axial growth takes place. If the nanowire has a hexagonal crystal structure, then the (0001) interface between the nanowire and the catalyst droplet represents the plane where axial growth takes place. Planes (111) and (0001) both represent the same (hexagonal) plane of the nanowire, it is just that the nomenclature of the plane varies depending on the crystal structure of the growing nanowire.

The nanowires are preferably grown by molecular beam epitaxy (MBE). Whilst it is within the scope of the invention for vapour deposition to be used, e.g. a CVD especially a metal organic CVD (MOCVD) or metal organic vapour phase epitaxy (MOVPE) method, the use of MBE is highly preferred. In this method, the substrate is provided with a molecular beam of each reactant, e.g. a group III element and a group V element preferably supplied simultaneously. A higher degree of control of the nucleation and growth of the nanowires on the graphitic substrate might be achieved with the MBE technique by using migration-enhanced epitaxy (MEE) or atomic-layer MBE (ALMBE) where e.g. the group III and V elements can be supplied alternatively.

A preferred technique is solid-source MBE, in which very pure elements such as gallium and arsenic are heated in separate effusion cells, until they begin to slowly evaporate (e.g. gallium) or sublimate (e.g. arsenic). The gaseous elements then condense on the substrate, where they may react with each other. In the example of gallium and arsenic, single-crystal gallium arsenide is formed. The use of the term "beam", implies that evaporated atoms (e.g. gallium) or molecules (e.g. $As_4$ or $As_2$) do not interact with each other or vacuum chamber gases until they reach the substrate.

Doping ions can also be introduced easily using MBE. FIG. 2 is a possible set up of a MBE process.

Molecular beam epitaxy (MBE) takes place in ultra high vacuum, with a background pressure of typically around $10^{-10}$ to $10^{-9}$ Torr. Nanostructures are typically grown slowly, such as at a speed of up to a few, such as about 10, μm per hour. This allows nanowires to grow epitaxially and maximises structural performance.

It is within the scope of the invention for nanowires to be grown in the presence or in the absence of a catalyst. Growing nanowires catalyst free is thus an embodiment of the invention.

Preferably a catalyst is used in the growth process. The catalyst can be one of the elements making up the nanowire—so called self catalysed, or different from any of the elements making up the nanowire.

For catalyst-assisted growth the catalyst may be Au or Ag or the catalyst may be a metal from the group used in the nanowire growth (e.g. group II or III metal), especially one of the metal elements making up the actual nanowire (self catalysis). It is thus possible to use another element from group III as a catalyst for growing a III-V nanowire e.g. use Ga as a catalyst for an In (group V) nanowire and so on. Preferably the catalyst is Au or the growth is self catalysed (i.e. Ga for a Ga (group V) nanowire and so on). The catalyst can be deposited onto the graphitic substrate to act as a nucleation site for the growth of the nanowires. Ideally, this can be achieved by providing a thin film of catalytic material formed over the substrate surface. When the catalyst film is melted (often forming a eutectic alloy with one or more of the semiconductor nanowire constituents), it forms droplets on the substrate and these droplets form the points where nanowires can grow. This is called vapour-liquid-solid growth (VLS) as the catalyst is the liquid, the molecular beam is the vapour and the nanowire provides the solid component. In some cases the catalyst particle can also be solid during the nanowire growth, by a so called vapour-solid-solid growth (VSS) mechanism. As the nanowire grows (by the VLS method), the liquid (e.g. gold) droplet stays on the top of the nanowire. This is depicted in the figures.

As noted above, it is also possible to prepare self catalysed nanowires. By self catalysed is meant that one of the components of the nanowire acts as a catalyst for its growth.

For example, a Ga layer can be applied to the substrate, melted to form droplets acting as nucleation sites for the growth of Ga containing nanowires. Again, a Ga metal portion may end up positioned on the top of the nanowire. A similar process can be effected using group II or group III metals as catalysts for nanowires containing the catalyst as a component.

In more detail, a Ga/In flux can be supplied to the substrate surface for a period of time to initiate the formation of Ga/In droplets on the surface upon heating of the substrate. The substrate temperature can then be set to a temperature suitable for the growth of the nanowire in question. The growth temperature may be in the range 300 to 700° C. The temperature employed is however specific to the nature of the material in the nanowire and the catalyst material. For GaAs, a preferred temperature is 590 to 630° C., e.g. 610° C. For InAs the range is lower, for example 430 to 540° C., such as 450° C.

Nanowire growth can be initiated by opening the shutter of the Ga/In effusion cell and the counter ion effusion cell, simultaneously once a catalyst film has been deposited and melted.

The temperature of the effusion cells can be used to control growth rate. Convenient growth rates, as measured during conventional planar (layer by layer) growth, are 0.05 to 2 µm per hour, e.g. 0.1 µm per hour. The pressure of the molecular beams can also be adjusted depending on the nature of the nanowire being grown. Suitable levels for beam equivalent pressures are between $1 \times 10^{-7}$ and $1 \times 10^{-5}$ Torr.

It has been surprisingly found that the use of MBE tends to cause the growth of GaAs nanowires vertically on the (111)B plane of a GaAs substrate.

The beam flux ratio between reactants (e.g. group III atoms and group V molecules) can be varied, the preferred flux ratio being dependent on other growth parameters and on the nature of the nanowire being grown.

It has been found that the beam flux ratio between reactants can affect crystal structure of the nanowire. For example, using Au as a catalyst, growth of GaAs nanowires with a growth temperature of 540° C., a Ga flux equivalent to a planar (layer by layer) growth rate of 0.6 µm per hour, and a beam equivalent pressure (BEP) of $9 \times 10^{-6}$ Torr for $As_4$ produces wurtzite crystal structure. As opposed to this, growth of GaAs nanowires at the same growth temperature, but with a Ga flux equivalent to a planar growth rate of 0.9 µm per hour and a BEP of $4 \times 10^{-6}$ Torr for $As_4$, produces zinc blende crystal structure.

Nanowire diameter can in some cases be varied by changing the growth parameters. For example, when growing self-catalyzed GaAs nanowires under conditions where the axial nanowire growth rate is determined by the $As_4$ flux, the nanowire diameter can be increased/decreased by increasing/decreasing the $Ga:As_4$ flux ratio. The skilled man is therefore able to manipulate the nanowire in a number of ways.

It is thus an embodiment of the invention to employ a multistep, such as two step, growth procedure, e.g. to separately optimize the nanowire nucleation and nanowire growth.

A significant benefit of MBE is that the growing nanowire can be analysed in situ, for instance by using reflection high-energy electron diffraction (RHEED). RHEED is a technique typically used to characterize the surface of crystalline materials. This technology cannot be applied so readily where nanowires are formed by other techniques such as MOVPE.

One limitation of the techniques described above is that there is limited control over where nanowires grow on the surface of the substrate. Nanowires will grow where a catalyst droplet forms but there is little control over where those droplets might form. A further problem is that the size of the droplets cannot easily be controlled. If droplets form which are too small to initiate nucleation of a nanowire, yields of nanowires may be low. This is a particular problem when using gold catalysis as the droplets formed by the gold can be too small to allow high yielding nanowire growth.

In order to prepare a more regular array of nanowires, the inventors envisage the use of a mask on the substrate. This mask can be provided with regular holes, where nanowires can grow homogeneously throughout the surface. The hole patterns in the mask can be easily fabricated using conventional photo/e-beam lithography or nanoimprinting. Focussed ion beam technology may also be used in order to create a regular array of nucleation sites on the graphitic surface for the nanowire growth.

Thus a mask can be applied to the substrate and etched with holes exposing the graphitic substrate surface, optionally in a regular pattern. Moreover, the size of the holes can be carefully controlled. Catalyst can then be introduced into those holes to provide nucleating sites for nanowire growth. By arranging the holes regularly, a regular pattern of nanowires can be grown.

Moreover, the size of the holes can be controlled to ensure that only one nanowire can grow in each hole. Finally, the holes can be made of a size where the droplet of catalyst that forms within the hole is sufficiently large to allow nanowire growth. In this way, a regular array of nanowires can be grown, even using Au catalysis.

The mask material can be any materials which do not damage the underlying graphitic layers significantly when deposited. The holes used in this embodiment may be slightly bigger than the nanowire diameter, e.g. up to 200 nm. The minimum hole size might be 50 nm, preferably at least 100-200 nm.

The mask itself can be made of an inert compound, such as silicon dioxide or silicon nitride. It can be provided on the substrate surface by any convenient technique such as by electron beam deposition, CVD, plasma enhanced-CVD, and sputtering. The mask itself can be less than 50 nm in thickness.

In order or prepare positioned Au catalysed nanowires on a graphitic substrate, a thin layer of Au, such as with a thickness less than 50 nm, can be deposited after etching the hole patterns in the mask. The deposition can be made with a photo or e-beam resist on top. By removing the photo or e-beam resist, a so called "lift-off" process, a regular arrayed pattern of Au dots on the graphitic substrate surface can be fabricated. Optionally the mask may be partially or completely removed after fabrication.

Whilst it is preferred in the present invention to employ catalyst assisted growth techniques, it is envisaged that nanowires may be grown on graphitic substrates in the absence of catalyst. This may be especially possible in conjunction with a mask.

In particular, the simple use of vapour-solid growth may enable nanowire growth. Thus, in the context of MBE, simple application of the reactants, e.g. In and As, to the substrate without any catalyst can result in the formation of a nanowire. This forms a further aspect of the invention which therefore provides the direct growth of a semiconductor nanowire formed from the elements described above on a graphitic substrate. The term direct implies therefore the absence of a film of catalyst to enable growth.

As noted above, the nanowires of the invention preferably grow as cubic (zinc blende) or hexagonal (wurtzite) structures. The inventors have found that it is possible to change the crystal structure of the growing nanowire by manipulating the amounts of the reactants fed to the substrate as discussed above. Higher feeds of Ga, for example, force a GaAs crystal into the cubic crystal structure. Lower feeds encourage a hexagonal structure. By manipulating reactant concentrations, the crystal structure within the nanowire can therefore be changed.

The introduction of different crystal structures enables differing electronic properties to be present in the nanowire. This may enable the formation of crystal phase quantum dots and allow other interesting electronic technologies to be developed.

It is also within the scope of the invention for the nature of the material forming the nanowire to be changed during the growing process. Thus, by changing the nature of the molecular beams, a portion of different structure would be introduced into a nanowire. An initial GaAs nanowire could be extended with an InAs nanowire section for example by changing from a Ga feed to an In feed. The GaAs/InAs nanowire could then be extended with a GaAs nanowire section by changing back to a Ga feed and so on. Again, by developing different structures with differing electrical properties, the inventors offer nanowires with interesting and manipulable electronic properties which can be tailored by the manufacturer towards all manner of end applications.

The nanowires of the invention may be coated by known methods, e.g. with radial epitaxial shells. For example, a mix of intrinsic and extrinsic semiconductors can be formed by coating an intrinsic or extrinsic core nanowire with a shell of the other type of semiconductor. A more complex nanowire can also be formed from a mix of extrinsic and intrinsic conductors. An insulating intrinsic layer can be placed between p and n doped extrinsic layers for instance. A p-doped core can therefore be covered by an intrinsic semi-conductor shell with an n-doped extrinsic conductor shell on the outside (or vice versa). This has particular application in light-emitting diode and solar cell technology.

Shell coating can be effected by MBE or other epitaxial technique (e.g. MOVPE) using appropriate growth parameters that will be known/clear to the skilled man. The invention enables the production of nanowires on graphitic substrates in only one predetermined direction. Such structures facilitate the growth of a single-domain coalescence layers with the nanowires as templates or the manufacturing of semiconductor devices for electronic, optoelectronic, photonic applications, etc.

Applications

The nanowires of the invention have wide ranging utility. They are semiconductors so can be expected to offer applications in any field where semiconductor technology is useful. They are primarily of use in integrated nanoelectronics and nano-optoelectronic applications.

An ideal device for their deployment might be a nanowire solar cell. Such solar cell has the potential to be efficient, cheap and flexible at the same time. This is a rapidly developing field and further applications on these valuable materials will be found in the next years.

Semiconductor nanowires are also candidates for field emission emitters due to their sharp tips, high aspect ratio, and high thermal and mechanical stability. Their very high surface area to volume ratio can be exploited in biological and chemical sensors, efficient energy conversion and storage devices.

The same concept can be used to also fabricate light-emitting diodes (LEDs), waveguides and lasers.

The invention will now be further discussed in relation to the following non limiting examples and figures.

Figure 1A:
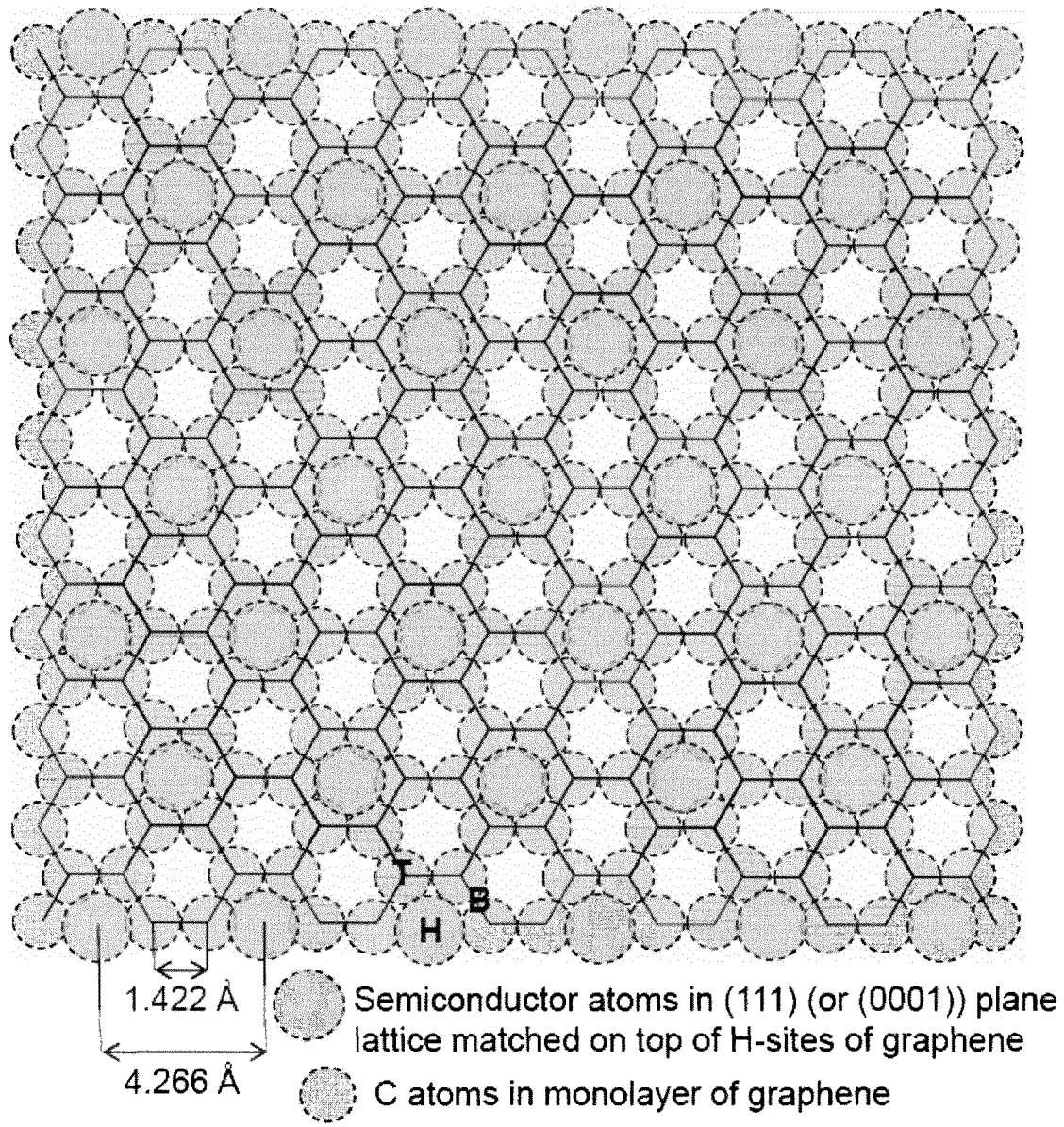
FIG. 1a shows the hexagonal positions of the carbon atoms (gray circles) of the graphitic substrate and the hexagonal positions of the semiconductor atoms (yellow circles) in the (111) and (0001) plane of a cubic or hexagonal crystal structure, respectively. The spacing between the semiconductor atoms (4.266 Å=3×1.422 Å (carbon atom distance)) needed in order to achieve exact lattice match with the graphitic substrate is depicted. In this example the semiconductor atoms are placed above some particular hollow (H-site) centres of the hexagonal carbon rings. Instead of being placed on top of H-sites, all the semiconductor atoms may also be rigidly shifted so that they are above a bridge (B-site) between carbon atoms or all centred above top (T-site) of carbon atoms in a way that a hexagonal symmetric pattern is still maintained.
Figure 1B:
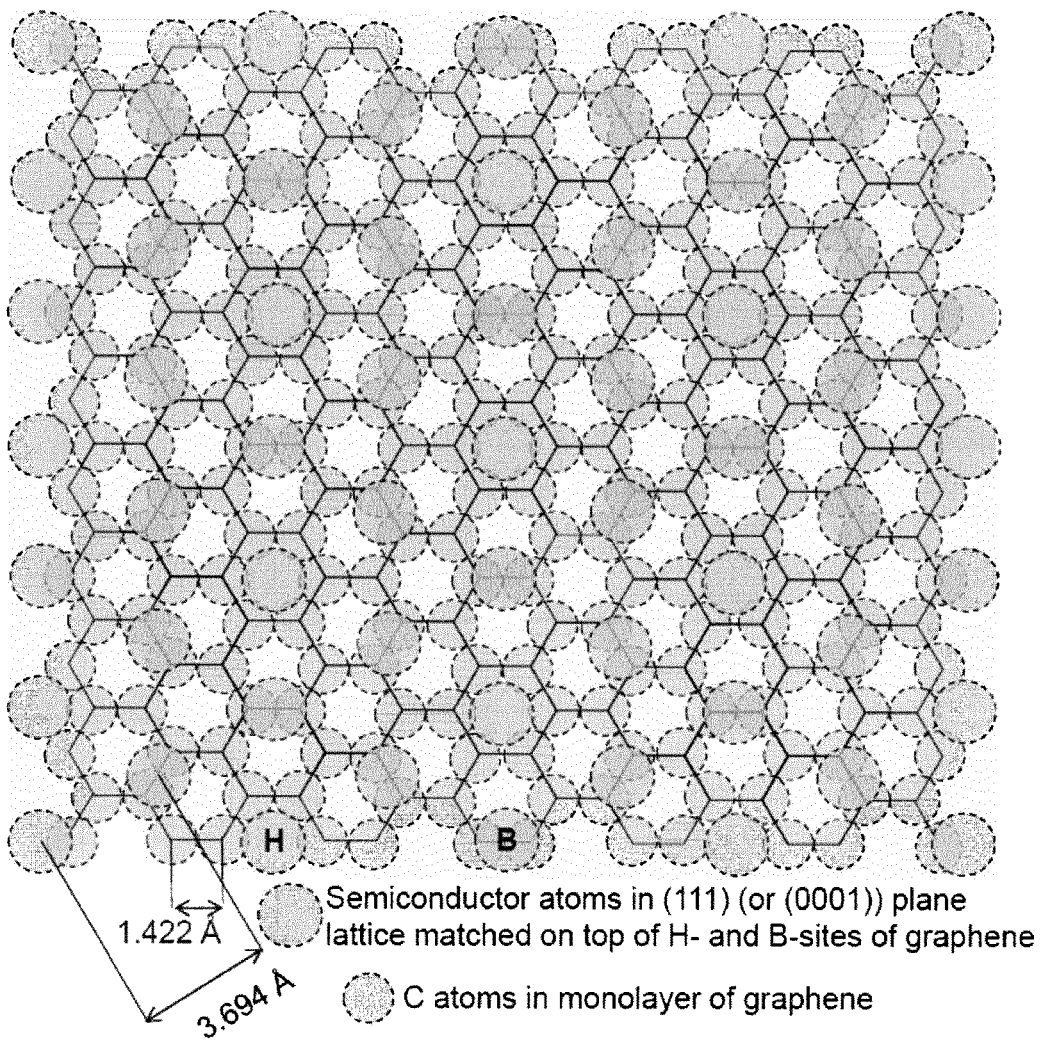
FIG. 1b shows the positions of the semiconductor atoms in the (111) and (0001) plane of a cubic or hexagonal crystal structure, respectively, on top of H- and B-sites of the carbon atoms of the graphene surface. The spacing between the semiconductor atoms (3.694 Å=3/2×sqr(3)×1.422 Å (carbon atom distance)) needed in order to achieve exact lattice match with the graphitic substrate is depicted.
Figure 1C:
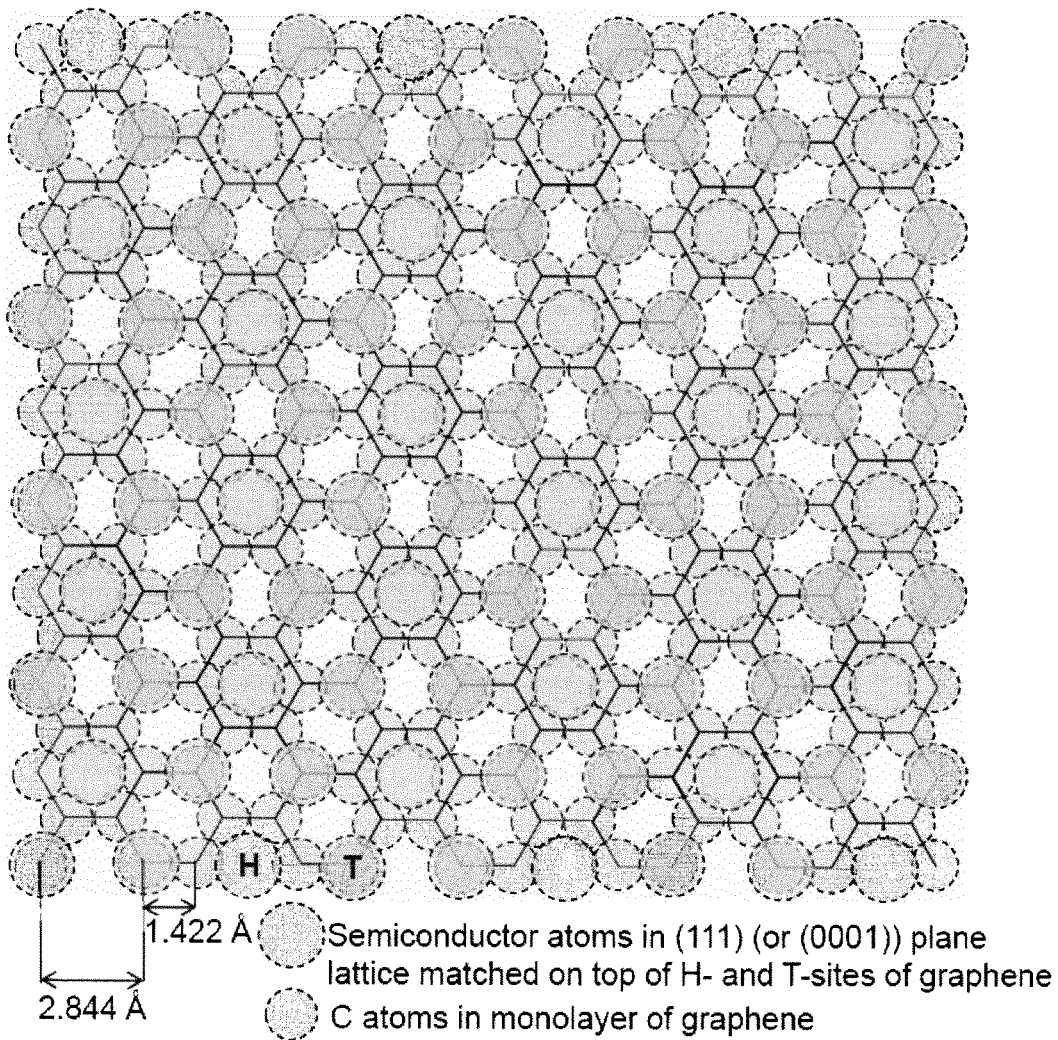
FIG. 1c shows the positions of the semiconductor atoms in the (111) and (0001) plane of a cubic or hexagonal crystal structure, respectively, on top of H- and T-sites of the carbon atoms of the graphene surface. The spacing between the semiconductor atoms (2.844 Å=2×1.422 Å (carbon atom distance)) needed in order to achieve exact lattice match with the graphitic substrate is depicted.
Figure 2:
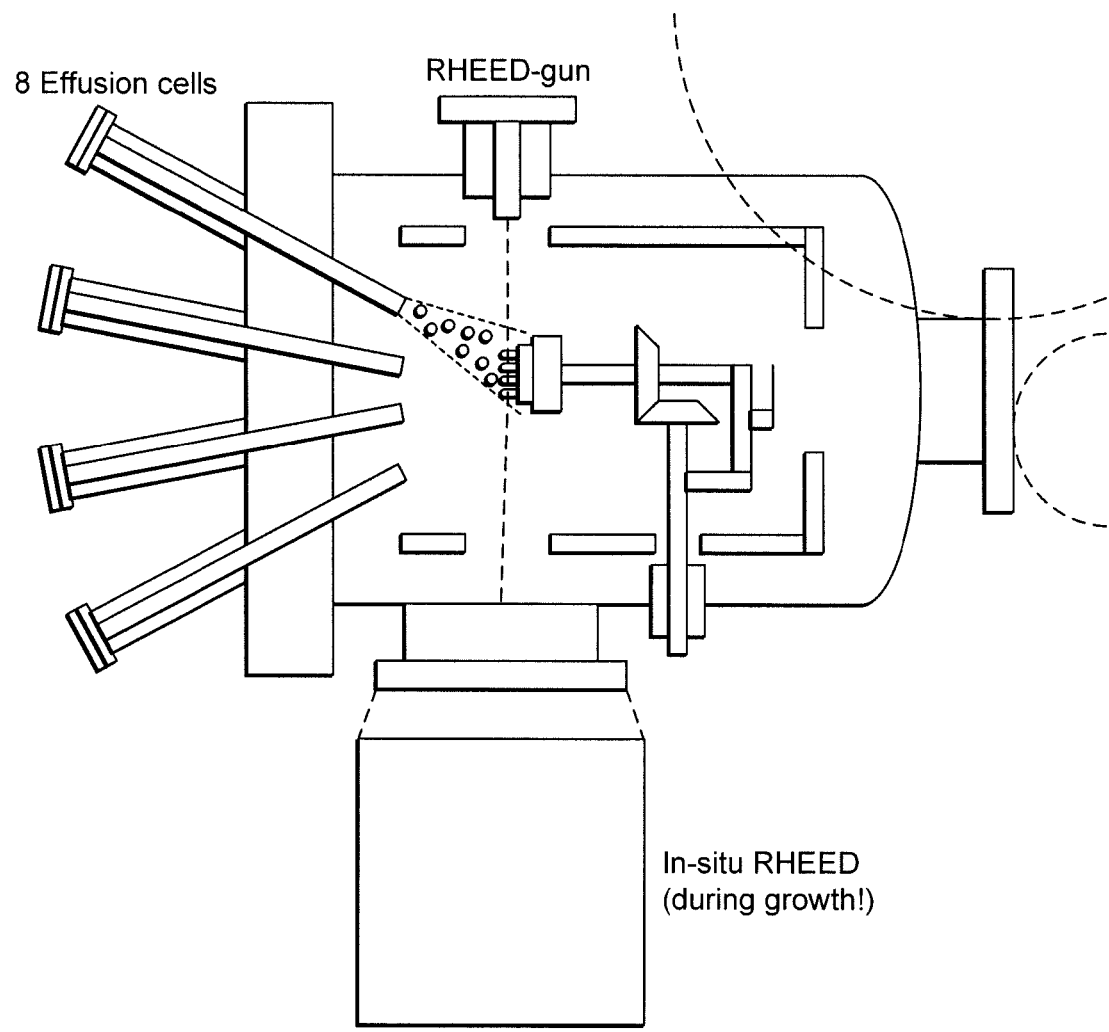
FIG. 2 shows a MBE experimental set up.
Figure 3A:
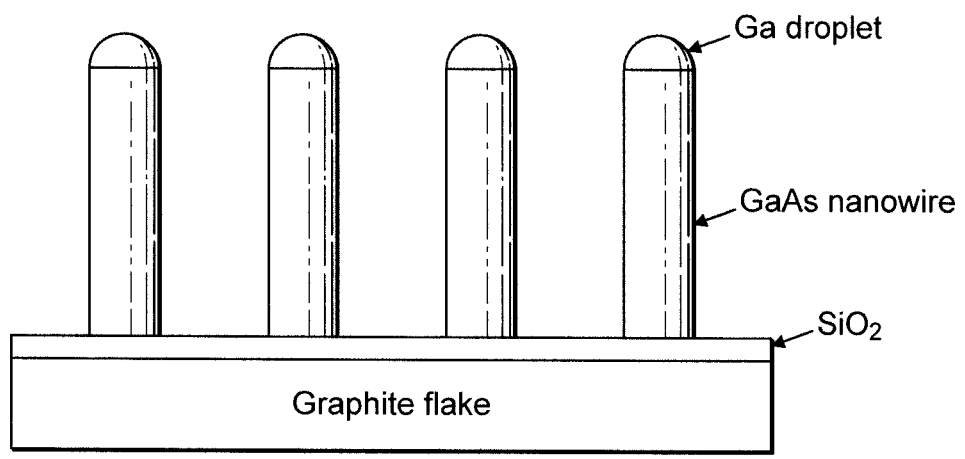
FIG. 3a is an idealised depiction of Ga (self) catalysed GaAs nanowires grown on graphite.
Figure 3B:
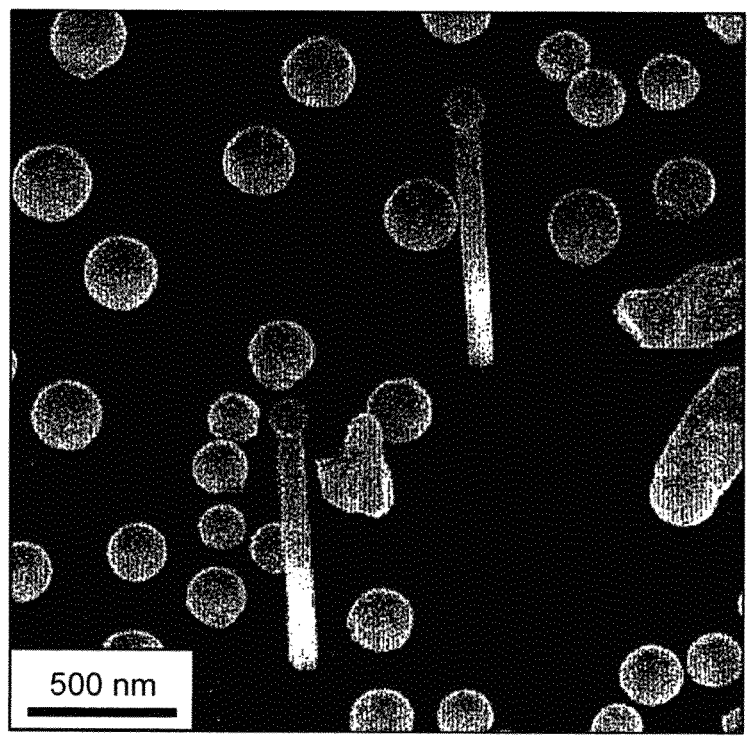
FIG. 3b is a 45° tilted view SEM image of two vertical Ga assisted GaAs nanowires grown by MBE on a flake of Kish graphite. The spherical particles are Ga droplets.
Figure 3C:
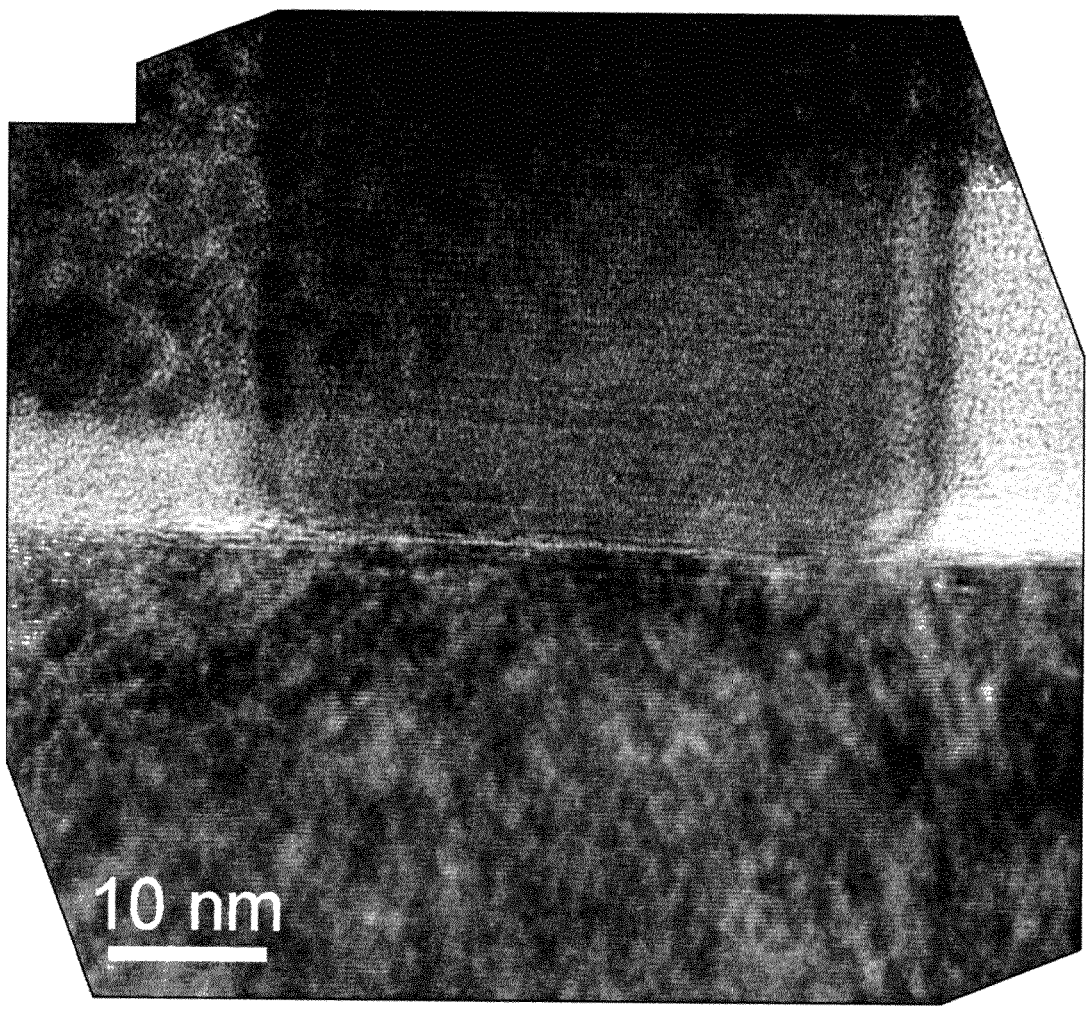
FIG. 3c is a cross sectional TEM image of the graphite/nanowire interface of a vertical Ga-assisted GaAs nanowire grown epitaxially on top of Kish graphite.
Figure 4:
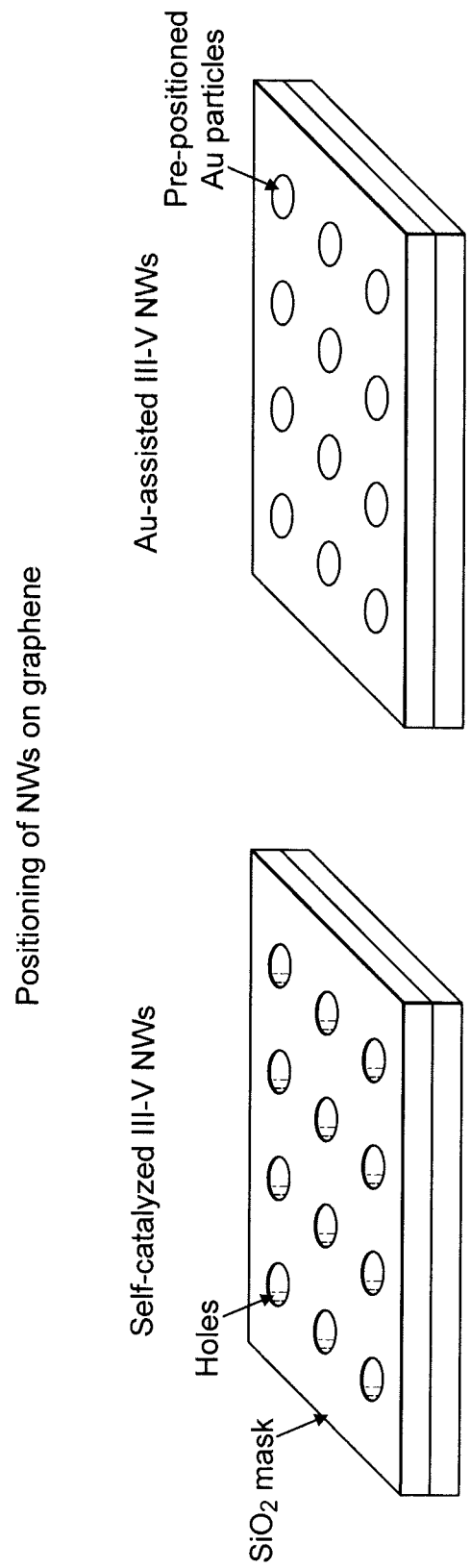
FIG. 4 shows a depiction of a mask on the graphite surface, which has been etched with holes.

The invention will now be described with reference to the following non limiting examples.

EXAMPLE 1

Experimental Procedure:

Nanowires (NWs) were grown in a Varian Gen II Modular molecular beam epitaxy (MBE) system equipped with a Ga dual filament cell, an In SUMO dual filament cell, and an As valved cracker cell, allowing to fix the proportion of dimers and tetramers. In the present study, the major species of arsenic were $As_4$. Growth of NWs is performed either on a Kish graphite flake or on a graphene film (1 to 7 monolayers thick) grown by a chemical vapor deposition (CVD) technique directly on a Ni film deposited on an oxidized silicon wafer. The CVD graphene films were bought from "Graphene Supermarket", USA. The samples were prepared using two different procedures. In the first procedure, the samples were cleaned by iso-propanol followed by a blow dry with nitrogen, and then In-bonded to the silicon wafer.

In the second procedure, a ~30 nm thick SiO$_2$ layer was deposited in an e-beam evaporator chamber on the samples prepared using the first procedure where after holes of ~100 nm in diameter were fabricated in the SiO$_2$ using e-beam lithography and plasma etching.

The samples were then loaded into the MBE system for the NW growth. The Ga/In flux was first supplied to the surface during a time interval typically in the range 5 s to 10 minutes, dependent on Ga/In flux and desired droplet size, while the As shutter was closed, to initiate the formation of Ga/In droplets on the surface. The substrate temperature was increased to a temperature suitable for GaAs/InAs NW growth: i.e. 610° C./450° C., respectively. GaAs/InAs NW growth was initiated by simultaneously opening the shutter of the Ga/In effusion cell and the shutter and valve of the As effusion cell. The temperature of the Ga/In effusion cell was preset to yield a nominal planar growth rate of 0.1 μm per hour. To form the GaAs NWs, an As$_4$ flux of $1.1 \times 10^{-6}$ Torr is used, whereas the As$_4$ flux is set to $4 \times 10^{-6}$ Torr to form InAs NWs.

The invention claimed is:

1. A composition of matter comprising at least one epitaxial nanowire on a graphitic substrate wherein said at least one epitaxial nanowire comprises at least one group III-V compound or at least one group II-VI compound, wherein said at least one epitaxial nanowire is in the [111] or [0001] direction, wherein the graphitic substrate comprises graphene, graphane or graphene oxide, and wherein said graphitic substrate is a laminated substrate exfoliated from a Kish graphite, a highly ordered pyrolytic graphite (HOPG), or CVD-grown graphene.

2. The composition as claimed in claim 1, wherein said at least one epitaxial nanowire comprises a group III-V compound.

3. The composition as claimed in claim 1, wherein said at least one epitaxial nanowire comprises GaSb, GaP, GaAs or InAs.

4. The composition as claimed in claim 1, wherein said graphitic substrate is flexible and transparent.

5. The composition as claimed in claim 1, wherein a surface of said graphitic substrate is modified with a plasma treatment with a gas of oxygen, hydrogen, NO$_2$, or their combinations.

6. The composition as claimed in claim 1, wherein a surface of said graphitic substrate is modified by chemical doping using a solution of FeCl$_3$, AuCl$_3$ or GaCl$_3$.

7. The composition as claimed in claim 1, wherein said at least one epitaxial nanowire is no more than 200 nm in diameter and has a length of up to 5 μm.

8. The composition as claimed in claim 1, wherein the composition comprises a plurality of said at least one epitaxial nanowires wherein said plurality of said at least one epitaxial nanowires are substantially parallel to each other.

9. The composition as claimed in claim 1, wherein said at least one epitaxial nanowire is grown in the presence of a catalyst.

10. A device comprising a composition as claimed in claim 1.

* * * * *